United States Patent
Shirata et al.

(10) Patent No.: US 11,862,657 B2
(45) Date of Patent: *Jan. 2, 2024

(54) SEMICONDUCTOR PACKAGE AND CAMERA MODULE

(71) Applicant: ASAHI KASEI MICRODEVICES CORPORATION, Tokyo (JP)

(72) Inventors: Osamu Shirata, Tokyo (JP); Yusuke Hidaka, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/856,309

(22) Filed: Jul. 1, 2022

(65) Prior Publication Data

US 2022/0336516 A1 Oct. 20, 2022

Related U.S. Application Data

(63) Continuation of application No. 17/001,738, filed on Aug. 25, 2020, now Pat. No. 11,411,038, which is a
(Continued)

(30) Foreign Application Priority Data

Nov. 28, 2017 (JP) .................................. 2017-227584
Oct. 24, 2018 (JP) .................................. 2018-200361

(51) Int. Cl.
*H01L 27/146* (2006.01)
*H04N 23/54* (2023.01)

(52) U.S. Cl.
CPC .. *H01L 27/14636* (2013.01); *H01L 27/14618* (2013.01); *H01L 27/14627* (2013.01); *H04N 23/54* (2023.01)

(58) Field of Classification Search
CPC ......... H01L 27/14636; H01L 27/14618; H01L 27/14627; H04N 5/2253
See application file for complete search history.

(56) References Cited

U.S. PATENT DOCUMENTS 6,433,422 B1   8/2002   Yamasaki
6,700,208 B1   3/2004   Yoneda
(Continued)

FOREIGN PATENT DOCUMENTS

JP    H08-046079 A    2/1996
JP    H10-107083 A    4/1998
(Continued)

*Primary Examiner* — Fernando L Toledo
*Assistant Examiner* — Neil R Prasad
(74) *Attorney, Agent, or Firm* — Morgan, Lewis & Bockius LLP

(57) ABSTRACT

To achieve a size reduction of a semiconductor package while securing stability in mounting. Three terminals t1, t2, and t4 are individually arranged on a semiconductor package 10 having a rectangular shape as viewed in plan in such a manner that the center in the longitudinal direction of the semiconductor package 10 of each of the three terminals t1, t2, and t4 and the center in the longitudinal direction of each of the other terminals are not overlapped with each other as viewed from the side of the long side. The terminal t4 and the other terminals t1 and t2 are arranged in such a manner that the terminal t4 and the other terminals t1 and t2 are present on mutually different sides across a line segment M passing through the center in the width direction, an angle θ formed by two line segments connecting the center of gravity of the terminal t4, the position in the longitudinal direction of which is the center, and the center of gravity of each of the other terminals t1 and t2 is 60° or more, and a width L1 of the semiconductor package 10 and a distance Lt between the rightmost end position of the terminal t4 arranged at the rightmost end in the width direction of the
(Continued)

semiconductor package 10 and the leftmost end position of the terminal t1 or t2 arranged at the leftmost position in the width direction satisfy Lt/L1≥0.5.

20 Claims, 5 Drawing Sheets

Related U.S. Application Data continuation of application No. 16/202,665, filed on Nov. 28, 2018, now Pat. No. 10,790,328.

(56) References Cited

U.S. PATENT DOCUMENTS

| | | | |
|---|---|---|---|
| 10,790,328 B2 * | 9/2020 | Shirata | H01L 27/14618 |
| 11,411,038 B2 * | 8/2022 | Shirata | H01L 27/14636 |
| 2001/0019852 A1 | 9/2001 | Hashimoto | |
| 2003/0027375 A1 | 2/2003 | Hashimoto | |
| 2004/0232531 A1 | 11/2004 | Song | |
| 2005/0218473 A1 | 10/2005 | Wakisaka | |
| 2006/0006529 A1 | 1/2006 | Lin | |
| 2006/0231935 A1 | 10/2006 | Nishida | |
| 2006/0252246 A1 | 11/2006 | Paik et al. | |
| 2012/0104625 A1 | 5/2012 | Park et al. | |
| 2012/0314307 A1 | 12/2012 | Kushima et al. | |
| 2017/0192195 A1 | 7/2017 | Murakami | |
| 2017/0278766 A1 | 9/2017 | Kim et al. | |
| 2018/0130750 A1 | 5/2018 | Jung et al. | |

FOREIGN PATENT DOCUMENTS

| | | |
|---|---|---|
| JP | 2000-340737 A | 12/2000 |
| JP | 2001-127198 A | 5/2001 |
| JP | 2004-096096 A | 3/2004 |
| JP | 2006-295164 A | 10/2006 |
| JP | 2007-005339 A | 1/2007 |
| JP | 2011-164321 A | 8/2011 |
| JP | 2012-255905 A | 12/2012 |
| JP | 2017-058523 A | 3/2017 |
| WO | 98/18164 A1 | 4/1998 |

* cited by examiner

FIG. 8A
FIG. 8B
(Prior Art)
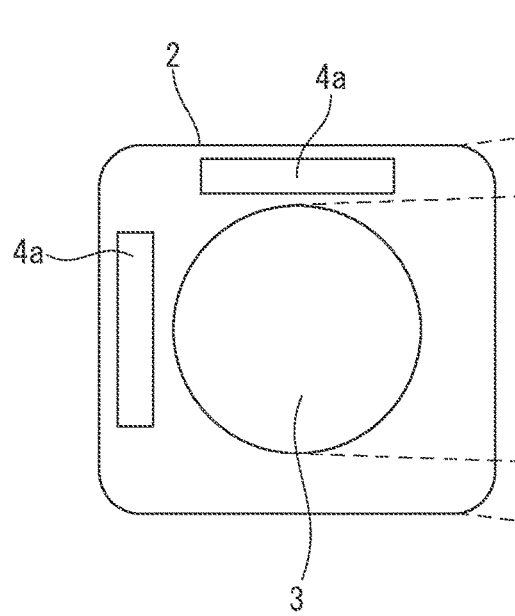
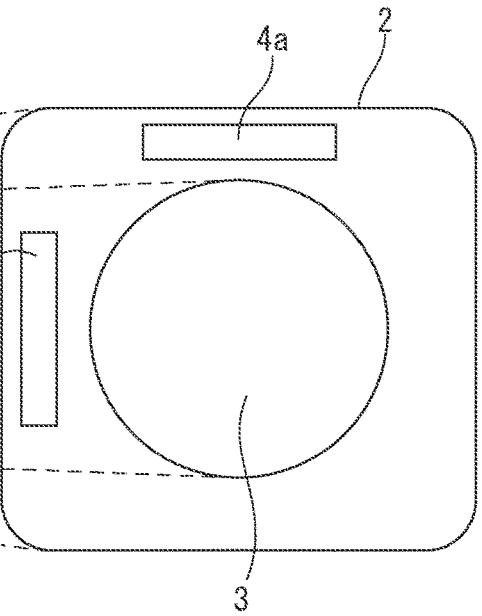
Lens → Large
Semiconductor package → Large
FIG. 9
(Prior Art)
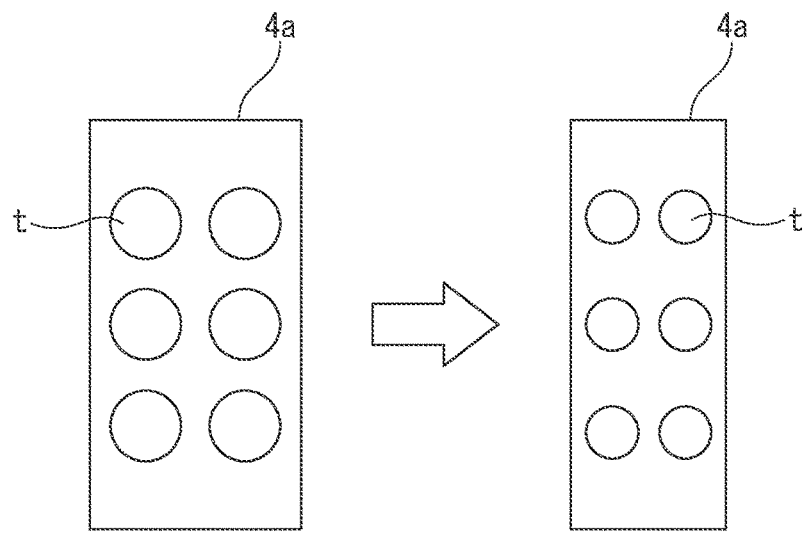

SEMICONDUCTOR PACKAGE AND CAMERA MODULE

RELATED APPLICATION DATA

This application is a continuation of and claims the benefit of priority to U.S. application Ser. No. 17/001,738, filed Aug. 25, 2020, which is a continuation of and claims the benefit of priority to U.S. application Ser. No. 16/202,665, filed Nov. 28, 2018, which claims the benefit of priority to Japanese Application No. 2018-200361, filed Oct. 24, 2018, and to Japanese Application No. 2017-227584, filed Nov. 28, 2017; the entire contents of each of these applications are incorporated herein by reference.

BACKGROUND OF THE INVENTION

Field of the Invention

The present invention relates to a semiconductor package and a camera module including the semiconductor package.

Description of the Related Art

In recent years, a camera module 2 is mounted in a mobile terminal 1, such as a smartphone or a cellular phone. The camera module 2 has a lens 3 of a camera, semiconductor packages 4a each mounted with a sensor 4 for position detection of the lens 3 and the like, and a lens control mechanism including a coil 5, a magnet 6, or the like for adjusting the position of the lens 3 and adjusting the position of the lens 3. The lens position control mechanism includes an autofocus mechanism, a hand shake correction mechanism, and the like. The lens position control mechanism detects the position of the lens 3 based on an output signal of the sensor 4 for position detection and the like, and then adjusts the position of the lens 3 in such a manner that the lens 3 is located at a target position (for example, see PTL 1).

In the camera module 2, constituent components configuring the lens position control mechanism are arranged along the periphery of a lens holder 3a supporting the lens 3 as viewed in plan or the lens 3, the semiconductor packages 4a each mounted with the sensor 4 for position detection and the like, the lens position control mechanism, and the like are configured as one unit.

CITATION LIST

Patent Literature

PTL 1: JP 2017-58523 A

SUMMARY OF THE INVENTION

Nowadays, the mobile terminal 1 has been demanded to enhance the performance of a camera and reduce the thickness.

As a measure for the enhancement of the performance of the camera, a method for increasing the aperture of the lens 3 is mentioned. However, it is necessary to arrange the sensor 4 for position detection and the constituent components included in the lens position control mechanism, such as the coil 5 and the magnet 6, around the lens 3 as illustrated in FIG. 6. Therefore, when the aperture of the lens 3 is increased, the size of the camera module 2 is also increased. When the camera module 2 is unitized as illustrated in FIGS. 8A and 8B, the unit size of the camera module 2 needs to increase, and therefore the demand for the size reduction of the mobile terminal 1 cannot be satisfied.

Herein, as one method for achieving the aperture increase of the lens 3 without causing the size increase of the camera module 2, a method for reducing the size of the semiconductor package 4a mounted with the sensor 4 for position detection included in the camera module 2 is considered. However, the size reduction of the semiconductor package 4a namely requires a size reduction of terminals t as illustrated in FIG. 9. When the size of the terminals t is reduced, there arises a problem that the stability in mounting decreases.

The present invention has been made focusing on an unsolved problem of a conventional technology. It is an object of the present invention to provide a semiconductor package and a camera module, the sizes of which can be reduced without reducing the stability in mounting.

To achieve the object, a semiconductor package according to one aspect of the present invention is a semiconductor package of a wafer level chip size package type, including at least three terminals, in which the semiconductor package has a long and narrow rectangular shape as viewed in plan, the three terminals are individually arranged in such a manner that the center in the longitudinal direction of the semiconductor package of each of the three terminals and the center in the longitudinal direction of each of the other terminals arranged on the semiconductor package are not overlapped with each other as viewed from the side of the long side of the semiconductor package, one terminal and the other two terminals among the three terminals are present on different sides across a line segment passing through the center in the width direction of the semiconductor package, an angle formed by two line segments connecting the center of gravity of the terminal, the position in the longitudinal direction of which is the center, among the three terminals and the center of gravity of each of the other two terminals is 60° or more, and a width L1 of the semiconductor package and a distance Lt between the rightmost end position of the terminal arranged at the rightmost end in the width direction of the semiconductor package among the three terminals and the leftmost end position of the terminal arranged at the leftmost end in the width direction satisfy Lt/L1≥0.5.

Moreover, a camera module according to another aspect of the present invention has two or more the semiconductor packages of the above-described aspect, in which the semiconductor packages are arranged along the periphery of an adjustment mechanism adjusting the lens position of a camera as viewed in plan and the longitudinal directions of the semiconductor packages are orthogonal to each other.

One aspect of the present invention can achieve a size reduction of a semiconductor package while securing the stability in mounting.

BRIEF DESCRIPTION OF THE DRAWINGS

FIGS. 8A and 8B are views for explaining a problem of a conventional semiconductor package.

FIG. 9 is a view for explaining a problem of a conventional semiconductor package.

DESCRIPTION OF THE PREFERRED EMBODIMENTS

Figure 1:
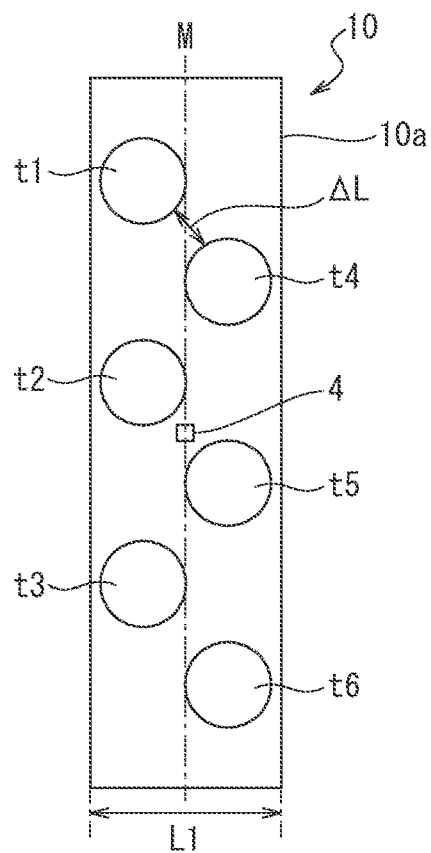
FIG. 1 is a plan view schematically illustrating an example of a semiconductor package according to one embodiment of the present invention.

In the following detailed description, a large number of particular specific configurations are described to provide a perfect understanding of an embodiment of the present invention. However, it is clear that the other embodiments can be implemented without being limited to such particular specific configurations. Moreover, the following embodiment does not limit the present invention according to Claims and includes all the combinations of characteristic configurations described in the embodiment.

Hereinafter, one embodiment of the present invention is described with reference to the drawings. In the following description of the drawings, the same portions are designated by the same reference numerals. The drawings are schematically illustrated and the relationship between the thickness and the plane dimension, the ratio of the thickness of each layer, and the like are different from the actual relationship, ratio, and the like.

Figure 5:
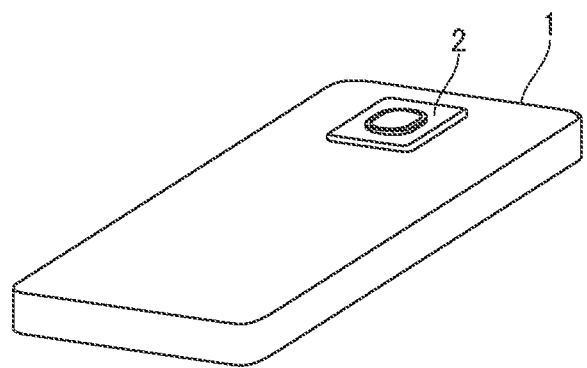
FIG. 5 is a perspective view illustrating an example of a mobile terminal to which the semiconductor package according to one embodiment of the present invention is applied.

The embodiment of the present invention describes a case where a semiconductor package 10 according to one embodiment of the present invention is applied to a semiconductor package 4a contained in a camera module 2 to be mounted in a mobile terminal 1, such as a smartphone or a cellular phone illustrated in FIG. 5. Although the case where the present invention is applied to the mobile terminal 1 is described herein, the present invention is applicable without being limited to the mobile terminal 1 and is applicable without being limited to the camera module.

FIG. 1 is a plan view schematically illustrating an example of the semiconductor package 10 according to one embodiment of the present invention.

The semiconductor package 10 according to one embodiment of the present invention is a WLCSP (Wafer Level Chip Size Package) and includes a wafer portion 10a and a plurality of terminals t arranged on the side of the mounting surface of the wafer portion 10a as illustrated in FIG. 1.

The semiconductor package 10 has a rectangular shape having an aspect ratio of about 2 or more and 4 or less as viewed in plan and has a short side length of 0.35 mm or more and 0.8 mm or less, for example. The "aspect ratio" indicates (Long side length/Short side length). The semiconductor package 10 includes the plurality of terminals t and the terminals t are arranged in zigzag and only two arrays are arranged in the width direction. The width of each terminal t is 0.15 mm or more and 0.3 mm or less. The width of the terminal t herein refers to the maximum value of the distance between the short sides facing each other when the terminal t is a rectangle as viewed in plan and refers to the diameter of a circle when the terminal t is a circle as viewed in plan. FIG. 1 illustrates a case where six terminals t1 to t6 are provided.

Figure 2:
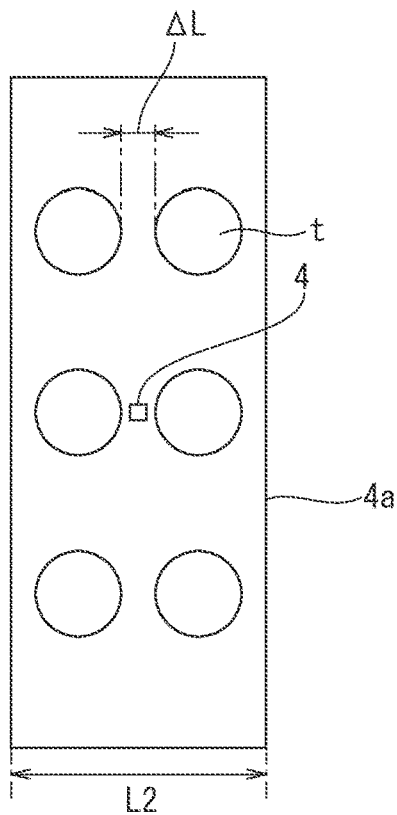
FIG. 2 is a view for explaining an effect of the semiconductor package according to one embodiment of the present invention.

Herein, when the terminals t having the same shape as the shape of the terminals t arranged on the semiconductor package 10 illustrated in FIG. 1 and having the same number as the number of the terminals t of the semiconductor package 10 are arranged in a lattice shape as illustrated in FIG. 2, the terminals t need to be arranged at a certain degree of interval in relation to wiring and the like. More specifically, it is necessary to secure an interval ΔL in the width direction of the semiconductor package 10 between the array of the terminals t arranged on one side and the array of the terminals t arranged on the other side.

On the other hand, when the terminals t are arranged in zigzag, the terminals t in the longitudinal direction of the semiconductor package 10 may be arranged in such a manner that the terminal t arranged on one side is present between the terminals t arranged on the other side. In this case, at least the interval ΔL may be secured between the terminal t on one side and the terminal t on the other side. Therefore, the interval ΔL may be secured not in the width direction of the semiconductor package 10 but in a direction crossing the width direction of the semiconductor package 10 between the terminal t1 and the terminal t4, for example. Therefore, the distance in the width direction of the semiconductor package 10 between the terminal on one side and the terminal on the other side is shorter than the ΔL.

Therefore, the width of the semiconductor package 10 is narrower in the case where the terminals t are arrange in zigzag as illustrated in FIG. 1 than in the case where the terminals t are arranged in the lattice shape as illustrated in FIG. 2 corresponding to the reduction in the interval in the width direction of the semiconductor package 10 between the terminals on one side and the terminals on the other side (L1<L2, in which L1 indicates the width of the semiconductor package (zigzag arrangement) 10 illustrated in FIG. 1 and L2 indicates the width of the semiconductor package (lattice shape arrangement) illustrated in FIG. 2). More specifically, the size of the semiconductor package 10 can be reduced in the width direction.

At this time, the terminal t of the semiconductor package illustrated in FIG. 1 and the terminal t of the semiconductor package 10 illustrated in FIG. 2 have the same shape and six terminals t are arranged in both the cases. Accordingly, by arranging the terminals t in zigzag as illustrated in FIG. 1, the size of the semiconductor package 10 can be reduced in the width direction while maintaining the same terminal shape and the same number of terminals. Therefore, even when the size of the semiconductor package 10 is reduced in the width direction, a reduction in stability in mounting can be suppressed.

When the terminals t are arranged in zigzag, the size of the semiconductor package 10 can be reduced in the width direction but, conversely, the length in the longitudinal direction increases as illustrated in FIG. 1 and FIG. 2.

Figure 3:
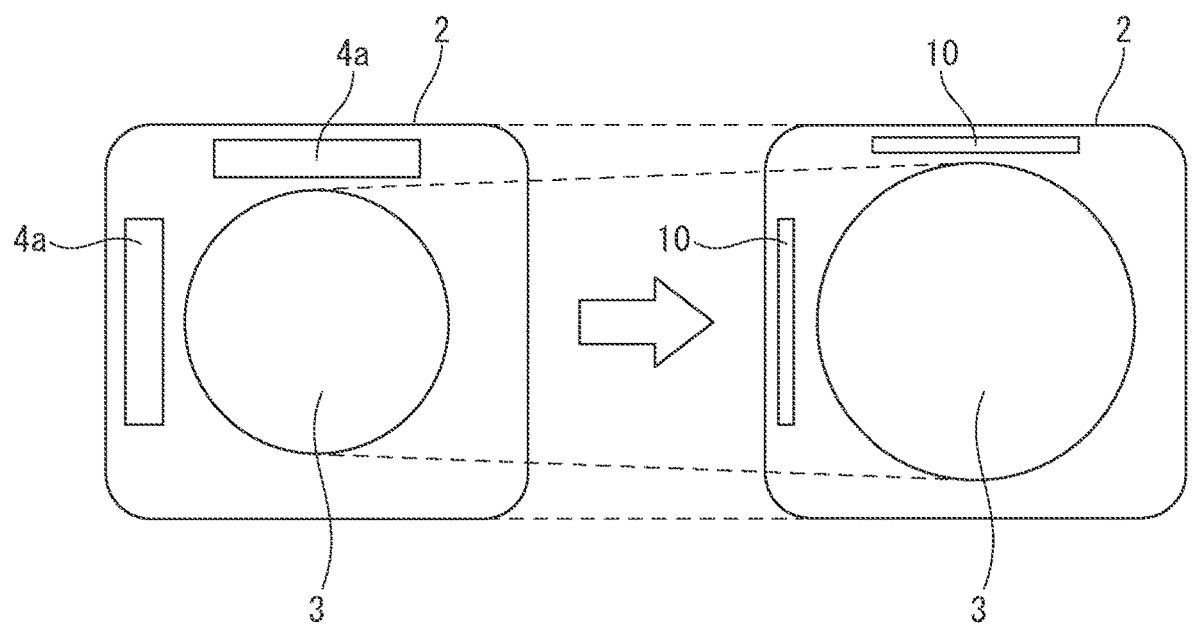
FIGS. 3A and 3B are views for explaining an effect of the semiconductor package according to one embodiment of the present invention.
Figure 6:
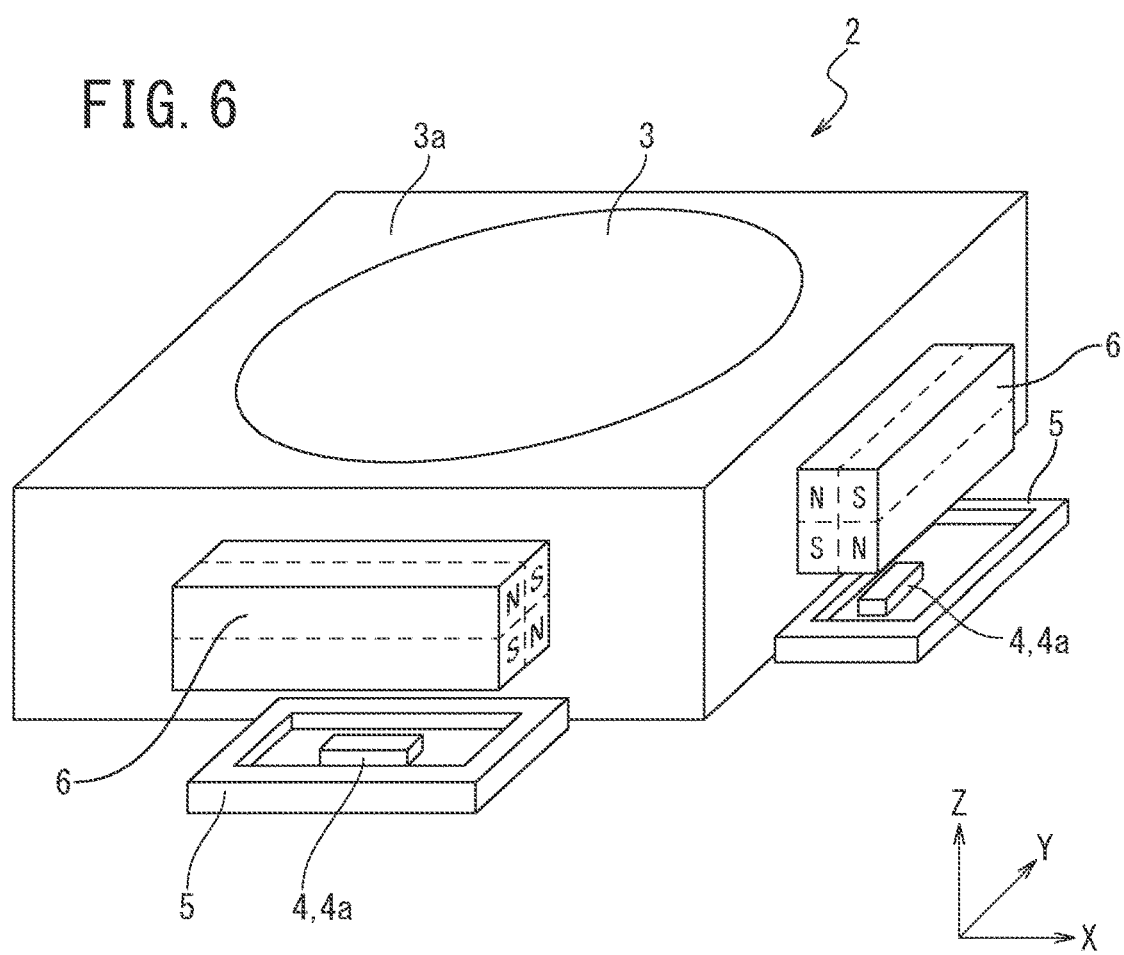
FIG. 6 is a schematic block diagram illustrating an example of a camera module.
Figure 7:
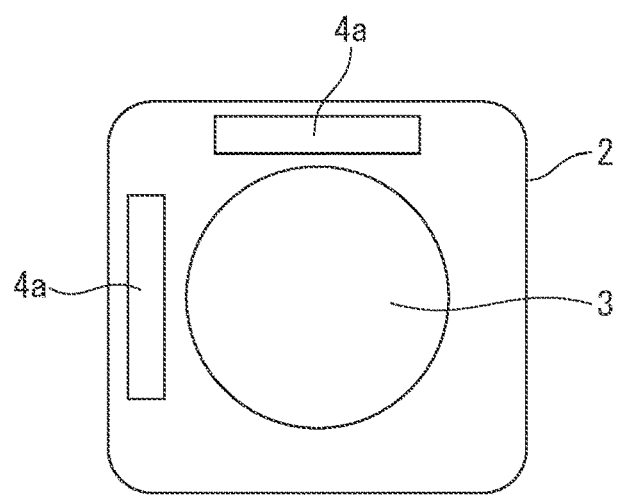
FIG. 7 is a plan view schematically illustrating an example of a unitized camera module.

Herein, as illustrated in FIG. 3A, the constituent components contained in the camera module 2, such as the semiconductor package 10, are arranged around the lens 3. More specifically, the constituent components are arranged around a lens position control mechanism performing position control of the lens 3, such as an autofocus mechanism and a hand shake correction mechanism, as illustrated in FIG. 6 or FIG. 7.

Moreover, a unit of the camera module 2 comparatively has space in the longitudinal direction of the semiconductor package 4a as illustrated in FIG. 3A. Therefore, the size reduction in the longitudinal direction of the semiconductor package 4a does not contribute to the size reduction of the unit of the camera module 2. Conversely, the width of the unit is mostly determined by the sum of the diameter of the lens 3 and the width of the semiconductor package 4a in the unit of the camera module 2 as illustrated in FIG. 3A. Therefore, the use of the semiconductor package 10 in which the size of the semiconductor package 4a is reduced in the width direction as illustrated in FIG. 3B in place of the semiconductor package 4a contributes to the size reduction of the camera module 2.

Therefore, as illustrated in FIG. 1, the size reduction of the camera module 2 or the unit of the camera module 2 can be achieved by the use of the semiconductor package 10 in which the terminals t are arranged in zigzag. More specifically, an increase in the aperture of the lens 3 can be achieved without increasing the size of the camera module 2 and the enhancement of the performance of the camera module 2 and the reduction in the thickness of the mobile terminal 1 mounted with the camera module 2 can be achieved.

Moreover, the width of the semiconductor package 10 can be reduced by arranging the terminals t in zigzag as described above. Therefore, when the size of a unit, such as the unit of the camera module 2, is determined by the width of a semiconductor package, the size reduction of the unit can be achieved by the use of the semiconductor package 10 according to one embodiment of the present invention as the semiconductor package.

Moreover, the space between the terminals t is comparatively larger in the semiconductor package 10 in which the terminals t are arranged in zigzag illustrated in FIG. 1 than in the semiconductor package 10 in which the terminals t are arranged in the lattice shape illustrated in FIG. 2. Therefore, the routing of wiring can be further facilitated. For example, the degrees of freedom of the arrangement positions of electronic components mounted in the semiconductor package 10, such as the sensor 4 for position detection, and the routing of wiring are higher.

When a hall element is used as the sensor 4 for position detection and wiring for current supply is connected to any two terminals t of the terminals t1 to t6 in the semiconductor package 10 illustrated in FIG. 1, there is a possibility that, when the wiring for current supply and the hall element are close to each other, for example, the hall element is affected by a leak magnetic field and the like due to the flow of a current through the wiring for current supply, which leads to a reduction in the detection accuracy of the sensor 4 for position detection. However, the semiconductor package 10 illustrated in FIG. 1 has higher degree of freedom of the arrangement position of the sensor 4 for position detection and the routing of wiring. Therefore, the reduction in the detection accuracy of the sensor 4 for position detection can be prevented by performing the arrangement of the sensor 4 for position detection and the routing of wiring in such a manner as to reduce the influence of the leak magnetic field and the like on the sensor 4 for position detection due to the flow of a current through the wiring for current supply. For example, by arranging the sensor 4 for position detection and the wiring for current supply to be apart from each other as far as possible, by setting the directions where a current flows to be opposite to each other between a pair of wiring for current supply to offset the leak magnetic field, or the like, the influence caused by the leak magnetic field given to the sensor 4 for position detection may be reduced. Moreover, also when the arrangement positions of the sensor 4 for position detection and the like need to be determined in consideration of the influence of the leak magnetic field of wiring, the degree of freedom of the arrangement position of the sensor 4 for position detection can be made higher because the degree of freedom of the routing of wiring is high in the semiconductor package 10 according to one embodiment of the present invention.

Moreover, in the semiconductor package 10 according to one embodiment of the present invention, the terminals t are arranged in two arrays in the width direction and are arranged in zigzag as illustrated in FIG. 1. More specifically, as viewed from the terminals t belonging to one array in the longitudinal direction of the semiconductor package 10, the terminals belonging to the next array are present in the obliquely upward direction or in the obliquely downward direction and are not present in the horizontal direction. Therefore, the wiring can be routed in the horizontal direction of the terminal t, and thus the routing of wiring is not limited.

Furthermore, the semiconductor package 10 can be more stably mounted in the case where the terminals t are arranged in the two arrays than in the case where the terminals t are arranged only in one array.

Moreover, when the terminals t are arranged in zigzag in the two arrays, the arrangement positions of the terminals t belonging to one array and the terminals t belonging to the other array approach the positions on the same straight line with a reduction in the interval in the width direction of the semiconductor package 10 between the terminals t belonging to one array and the terminals t belonging to the other array, and thus the stability in mounting decreases. Conversely, the stability in mounting increases with an increase in the interval in the width direction of the semiconductor package 10 between the terminals t belonging to one array and the terminals t belonging to the other array but the width of the semiconductor package 10 increases. Therefore, when the terminals t are arranged in zigzag, the terminals t need to be arranged at positions where both the stability in mounting and the width of the semiconductor package 10 are satisfied.

In the semiconductor package 10 according to one embodiment of the present invention, the terminals t1 to t3 belonging to one array and the terminals t4 to t6 belonging to the other array are arranged to be in contact with a line segment M passing through the center in the width direction of the semiconductor package 10 as illustrated in FIG. 1. Therefore, the semiconductor package 10 in which the stability in mounting is not excessively poor and in which the width of the semiconductor package 10 can be reduced to some extent can be obtained. Although the terminals t are arranged in zigzag to be in contact with the line segment M in FIG. 1, the arrangement is not limited thereto and the terminals t may be arranged at positions where the stability can be obtained in mounting and the width of the semiconductor package 10 is a desired value. More specifically, the terminals t may be arranged to be overlapped with the line segment M as viewed in plan to a degree such that the stability in mounting can be obtained or, conversely, the terminals t may be arranged at positions to be somewhat apart from the line segment M to a degree such that the width of the semiconductor package 10 can be reduced to some extent.

Moreover, the electronic components mounted in the semiconductor package 10, such as the sensor 4 for position detection, are preferably arranged at a position apart from the terminals t when the influence of a stress is taken into consideration, for example. When the sensor 4 for position detection is arranged in a central portion of the semiconductor package 10 as illustrated in FIG. 1, for example, the interval between the sensor 4 and the terminals t is longer and the width of the semiconductor package 10 is smaller in the semiconductor package 10 in which the six terminals t are arranged in zigzag illustrated in FIG. 1 than in the semiconductor package 10 in which the six terminals are arranged in the lattice shape illustrated in FIG. 2. Accordingly, the width of the semiconductor package 10 can be made narrower while reducing the influence of a stress.

Moreover, the width of the semiconductor package 10 is narrower but the length in the longitudinal direction of the semiconductor package 10 is longer in the semiconductor package 10 according to one embodiment of the present invention than in the semiconductor package 10 in which the terminals t are arranged in the lattice shape as described above. Therefore, the present invention is suitable for a semiconductor package to be arranged in the portion where there is much space in the longitudinal direction but there is not much space in the width direction of the semiconductor package 10.

Figure 4:
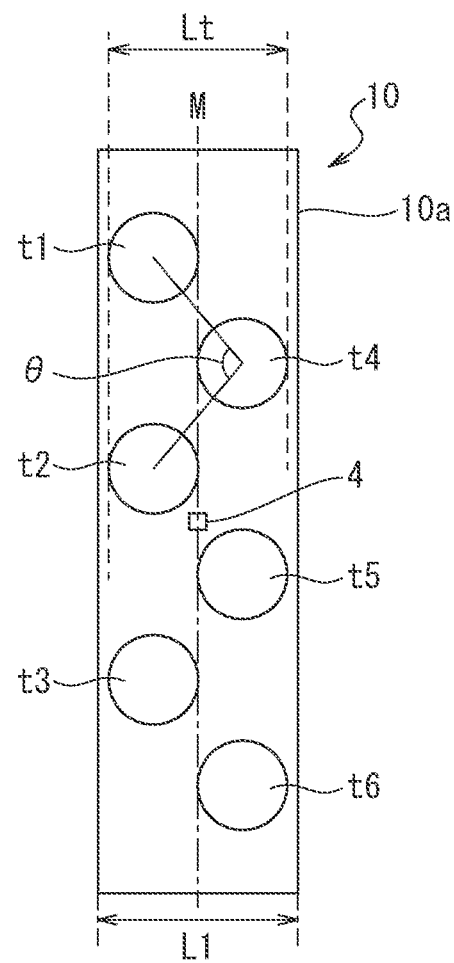
FIG. 4 is an explanatory view for explaining the arrangement conditions of the semiconductor package according to one embodiment of the present invention.

FIG. 1 describes that the terminals t are arranged in zigzag. However, when described in detail, the terminals t of the semiconductor package 10 are arranged in such a manner that (a) arbitrary three terminals (hereinafter also referred to as three terminals) are individually arranged in such a manner that each center of the three terminals t in the longitudinal direction of the semiconductor package 10 is not overlapped each other, and each center of the three terminals t in the longitudinal direction of the semiconductor package 10 and each center of the other terminals t arranged on the semiconductor package 10 in the longitudinal direction of the semiconductor package 10 are not overlapped with each other as viewed from the side of the long side of the semiconductor package 10 and one terminal t among the three terminals t (in FIG. 1, terminal t, the position in the longitudinal direction of which is the center) and the other two terminals are present on mutually different sides across the line segment M passing through the center in the width direction of the semiconductor package 10, (b) an angle θ formed by two line segments connecting the gravity of the terminal t positioned in a center in the longitudinal direction of the semiconductor package 10 among the three terminals t and the gravity of each of the other two terminals t is equal to or larger than a threshold value (for example, about 60°), and further (c) the width L1 of the semiconductor package 10 and the distance Lt between the rightmost end position of the terminal t arranged at the rightmost end position in the width direction of the semiconductor package 10 among the three terminals t and the leftmost end position of the terminal t arranged at the leftmost end position in the width direction satisfy Lt/L1≥0.5. More specifically, among the arbitrary three terminals t, e.g., the terminals t1, t2, and t4, the terminal t1, for example, is arranged in such a manner that each of the center in the longitudinal direction of the semiconductor package 10 of the terminals t1, t2 and t4 is not overlapped each other and each of the center in the longitudinal direction of the semiconductor package 10 of the terminals (terminals t1, t2 and t4 in the case of FIG. 4) and each of the other terminals t (t3, t5, t6) arranged on the semiconductor package 10 are not overlapped with each other as viewed from the side of the long side of the semiconductor package 10 and the other two terminals t2 and t4 among the three terminals t are similarly arranged as illustrated in FIG. 4. Furthermore, with respect to the three terminals t1, t2, and t4, the terminals t1 and t2 are arranged on the left side across the line segment M and the terminal t4 is arranged on the right side across the line segment M as illustrated in FIG. 4. Moreover, the angle θ formed by the line segment connecting the gravity of the terminal t4 positioned in a center in the longitudinal direction of the semiconductor package 10, among the three terminals and the gravity of the terminal t1 and the line segment connecting the gravity of the terminal t4 and the gravity of the terminal t2 is equal to or larger than the threshold value and the width L1 of the semiconductor package 10 and the distance Lt between the leftmost end position of the terminal t1 or t2 and the rightmost end position of the terminal t4 satisfy Lt/L1≥0.5. The description "present on mutually different sides across the line segment M passing through the center in the width direction of the semiconductor package 10" means that the centers of gravity of the terminals t1, t2, and t4 are present on different sides across the line segment M. The description "arranged in such a manner that each of the center in the longitudinal direction of the semiconductor package 10 of the three terminals t is not overlapped and each of the centers in the longitudinal direction of the semiconductor package 10 of the three terminals t and each center in the longitudinal direction of the semiconductor package 10 of the other terminals t arranged on the semiconductor package 10 are not overlapped with each other as viewed from the side of the long side of the semiconductor package 10" namely means that the three terminals t1, t2, and t4 may be arranged in such a manner that the wiring is not blocked by the other terminals t even when connected by drawing out the wiring from either the right or left side with respect to the three terminals t1, t2, and t4. Due to the fact that the three terminals t1, t2, and t4 are arranged as described above, the degree of freedom of the routing of wiring on the semiconductor package 10 can be secured. For example, the terminals t are arranged in such a manner that the interval between the centers in the longitudinal direction of the terminals t as viewed from the side of the long side of the semiconductor package 10 is 100 μm or more. The upper limit of the interval is not specified. However, the terminals t are arranged in such a manner that the interval between the centers in the longitudinal direction of the terminals t as viewed from the side of the long side of the package 10 is smaller than the long side of the semiconductor package 10.

Herein, when focused on the three terminals t1, t2, and t4, the terminal t4 is arranged on the right side and the terminals t1 and t2 are arranged on the left side across the line segment M and the numbers of the terminals t on the right and left sides are different from each other as illustrated in FIG. 4. More specifically, from the viewpoint of the number of the terminals t, the stability in the horizontal direction across the line segment M appears lower than in the case where the numbers of the terminals t on the right and left sides across the line segment M are the same. However, the three terminals, t1, t2, and t4 are arranged so that the angle θ formed by the line segment connecting the terminals t1 and t4 and the line segment connecting the terminals t2 and t4 is equal to or larger than a threshold value and the angle θ based on the terminal t4 positioned at the center in the longitudinal direction of the semiconductor package 10 is equal to or larger than a threshold value. Therefore, although the numbers of the terminals t on the right and left sides across the line segment M are different from each other, the stability in the horizontal direction can be secured and the stability also in the longitudinal direction can be secured. More specifically, even when the number of the terminals t is set to 3, the stability in the horizontal direction can be sufficiently secured.

Therefore, even when the number of terminals is 3, the stability in mounting of the semiconductor package 10 can be secured. More specifically, the number of the terminals t to be provided on the semiconductor package 10 may be at least 3 from the viewpoint of the stability in mounting and therefore there is no necessity of providing an unnecessary terminal, and thus the size in the longitudinal direction of the semiconductor package 10 can also be correspondingly reduced. When the three terminals t satisfying the above-described arrangement conditions (a) to (c) or a comparatively small number of terminals t including the three terminals t are provided on the semiconductor package 10, the two terminals t among the three terminals t satisfying the above-described arrangement conditions (a) to (c) are preferably individually arranged in the vicinity of both ends in the longitudinal direction of the semiconductor package 10.

Moreover, the terminals t1, t2, and t4 are arranged in such a manner that the distance Lt between the rightmost end of the terminal t4 and the leftmost end of the terminals t1 and t2 and the width L1 of the semiconductor package 10 satisfy Lt/L1≥0.5 and the terminals t1, t2, and t4 are arranged in such a manner that the distance Lt in the horizontal direction between the terminals t1, t2, and t4 is at least ½ or more of the width L1 of the semiconductor package 10. Therefore, the stability in mounting in the horizontal direction can be further secured.

In the three terminals t1, t2, and t4, the distance in the longitudinal direction between the terminals t1 and t4 may be different from the distance in the longitudinal direction between the terminals t2 and t4 as viewed in plan.

Moreover, the terminals t1 and t2 do not necessarily need to be arranged on the same straight line along the longitudinal direction of the semiconductor package 10 and the terminal t2 may be arranged at a position close to the line segment M or on the line segment M as viewed in plan.

Although the terminal t4, the position in the longitudinal direction of the semiconductor package 10 is the center, among the terminals t1, t2, and t4 is arranged on the right side across the line segment M and the remaining terminals t1 and t2 are arranged on the left side across the line segment M as the arrangement satisfying the above-described arrangement condition (a) in FIG. 4, the arrangement is not limited thereto.

For example, in FIG. 4, the terminal t1, the terminal t4, and the terminal t5 instead of the terminal t2 may be set as one set of the three terminals t satisfying the above-described arrangement conditions (a) to (c). More specifically, the terminal t1, the position in the longitudinal direction of the semiconductor package 10 of which is an end portion, may be arranged on the left side across the line segment M and the remaining terminals t4 and t5 may be arranged on the right side across the line segment M. However, it is more preferable from the viewpoint of the stability in the width direction of the semiconductor package 10 that the terminal t4, the position in the longitudinal direction of the semiconductor package 10 is the center, is arranged on one side across the line segment M and the remaining two terminals are arranged on the other side across the line segment M as in the terminals t1, t2, and t4.

When four or more terminals t are arranged, the other terminals t except the three terminal t1, t2, and t4 satisfying the above-described arrangement conditions (a) to (c) may be arranged at positions where the center in the longitudinal direction of the semiconductor package 10 of each of the three terminals t1, t2, and t4 is not overlapped each other, and the center in the longitudinal direction of the semiconductor package 10 of each of the three terminals t1, t2, and t4 and the center in the longitudinal direction of the semiconductor package 10 of each of the other terminals t except the three terminals t1, t2, and t4 are not overlapped with each other as viewed from the side of the long side of the semiconductor package 10. For example, in the set of the three terminals t1, t4, and t5 satisfying the above-described arrangement conditions (a) to (c), the terminal t may be arranged at the position of the t2 in FIG. 4. In this case, the center in the longitudinal direction of the semiconductor package 10 of each of the terminals t1, t4, and t5 and the center in the longitudinal direction of the semiconductor package 10 of the terminal t2 are not overlapped with each other as viewed from the side of the long side of the semiconductor package 10.

Moreover, a new terminal may be arranged between the terminal t5 and a terminal t6 in FIG. 4.

It is preferable from the viewpoint of the degree of freedom of the routing of wiring that all the terminals t arranged on the semiconductor package 10 containing the three terminal t1, t2, and t4, for example, satisfying the above-described arrangement conditions (a) to (c) are arranged at positions where the centers in the longitudinal direction of the semiconductor package 10 of the terminals t are not overlapped with each other as viewed from the side of the long side of the semiconductor package 10. The terminals t may not be arranged at equal intervals in the longitudinal direction.

The other terminals t except the three terminal t1, t2, and t4 may also be arranged to satisfy the arrangement conditions (a) to (c) as with the three terminals t1, t2, and t4 while forming one set by the three terminals t. More specifically, the terminals t may be arranged so that two or more of the sets of the terminals t satisfying the arrangement conditions (a) to (c) may be present. Moreover, the terminals t may be arranged to satisfy the arrangement conditions (a) to (c) in each of all the combinations obtained by selecting three terminals t containing two terminals t arranged on the right and left sides across the line segment M. When two or more of the sets of the three terminals t satisfying the arrangement conditions (a) to (c) are arranged, one set is preferably arranged in the vicinity of each of both ends in the longitudinal direction of the semiconductor package 10.

When a plurality of number of the terminals t are arranged in such a manner as to satisfy the arrangement conditions (a) to (c), it is preferable to arrange the terminals t so that the sum of the number of the terminals t arranged on each of the right and left sides across the line segment M is the same. By arranging the terminals t as described above, also due to the fact that the numbers of the terminals t on the right and left sides are equal to each other, the stability in mounting of the semiconductor package 10 can be improved.

Although the embodiment described above describes the case where the six terminals t are provided, the number of the terminals t is not limited to six and the present invention is applicable even in the case of the semiconductor package 10 including an arbitrary number, 4 or more and 10 or less, of the terminals t, such as four terminals t, six terminals t, eight terminals t, and ten terminals t. The number of the terminals t is preferably an even number to stabilize the balance in the width direction of the semiconductor package 10 in mounting.

The sensor 4 for position detection is not limited to the case of being mounted in the semiconductor package 10 and may be formed separately from the semiconductor package 10.

The semiconductor package 10 may be stored in the unit as illustrated in FIG. 7 and may be arranged on the outside of a member supporting the lens 3 as with the coil 5 or the magnet 6 as illustrated in FIG. 6.

The semiconductor package 10 is not limited to one mounted with the sensor 4 for position detection and may be mounted with the other electronic components.

As described above, the embodiment of the present invention is described but the above-described embodiment describes devise and methods for embodying the technical idea of the present invention and the technical idea of the present invention does not specify the materials, shapes, structures, arrangement, and the like of constituent components. The technical idea of the present invention can be variously altered within the technical scope specified by Claims.

Description of Reference Numerals 1 mobile terminal
2 camera module
3 lens
4 sensor for position detection
4a semiconductor package
5 coil
6 magnet
10 semiconductor package
10a wafer portion
t1 to t6 terminal

What is claimed is:

1. A semiconductor package comprising terminals,
wherein the semiconductor package has a width and a length as viewed in plan, the length being greater than the width,
wherein, for any three terminals from among all of the terminals, an angle formed by two line segments connecting a center of gravity of a terminal positioned in a center in a longitudinal direction and a center of gravity of each of the other two terminals is 60° or more,
wherein the width L1 of the semiconductor package and a distance Lt between a rightmost end position of a terminal arranged at a rightmost end in a width direction of the semiconductor package among all of the terminals and a leftmost end position of a terminal arranged at a leftmost end in the width direction satisfy Lt/L1≥0.5,
wherein all of the terminals are spaced apart from a line segment passing through a center in the width direction of the semiconductor package with a first center of gravity of a first portion of all the terminals arranged on a first side across the line segment and a second center of gravity of a second portion of all the terminals other than the first portion arranged on a second side across the line segment,
wherein a number of terminals in the first portion and a number terminals in the second portion are equal, and
wherein the semiconductor package is a wafer level chip size.

2. The semiconductor package according to claim 1, further comprising a wiring connected to the terminals, wherein the wiring is routed in a horizontal direction from the terminals as viewed in plan.

3. The semiconductor package according to claim 2, wherein the wiring is routed in a long direction from the terminals as viewed in plan.

4. The semiconductor package according to claim 1, wherein the terminals are arranged in zigzag along the longitudinal direction of the semiconductor package, and only two arrays are arranged in the width direction.

5. The semiconductor package according to claim 1, wherein an aspect ratio is 2 or more and 4 or less, a short side is 0.35 mm or more and 0.8 mm or less, and a width of the terminal is 0.15 mm or more and 0.3 mm or less.

6. The semiconductor package according to claim 1, wherein the semiconductor package includes 4 or more and 10 or less terminals as the terminals.

7. The semiconductor package according to claim 1, wherein the semiconductor package includes a sensor.

8. A camera module, comprising:
two or more of the semiconductor packages according to claim 1,
wherein the semiconductor packages are arranged along a periphery of an adjustment mechanism adjusting a lens position of a camera as viewed in plan, and the longitudinal directions of the semiconductor packages are orthogonal to each other.

9. The semiconductor package according to claim 4, further comprising a wiring connected to the terminals, wherein the wiring is routed in a horizontal direction from the terminals as viewed in plan.

10. The semiconductor package according to claim 2, wherein an aspect ratio is 2 or more and 4 or less, a short side is 0.35 mm or more and 0.8 mm or less, and a width of the terminal is 0.15 mm or more and 0.3 mm or less.

11. The semiconductor package according to claim 3, wherein an aspect ratio is 2 or more and 4 or less, a short side is 0.35 mm or more and 0.8 mm or less, and a width of the terminal is 0.15 mm or more and 0.3 mm or less.

12. The semiconductor package according to claim 4, wherein an aspect ratio is 2 or more and 4 or less, a short side is 0.35 mm or more and 0.8 mm or less, and a width of the terminal is 0.15 mm or more and 0.3 mm or less.

13. The semiconductor package according to claim 2, wherein the semiconductor package includes 4 or more and 10 or less terminals as the terminals.

14. The semiconductor package according to claim 3, wherein the semiconductor package includes 4 or more and 10 or less terminals as the terminals.

15. The semiconductor package according to claim 4, wherein the semiconductor package includes 4 or more and 10 or less terminals as the terminals.

16. The semiconductor package according to claim 2, wherein the semiconductor package includes a sensor.

17. The semiconductor package according to claim 3, wherein the semiconductor package includes a sensor.

18. The semiconductor package according to claim 4, wherein the semiconductor package includes a sensor.

19. A camera module, comprising:
two or more of the semiconductor packages according to claim 2,
wherein the semiconductor packages are arranged along a periphery of an adjustment mechanism adjusting a lens position of a camera as viewed in plan, and
wherein the longitudinal directions of the semiconductor packages are orthogonal to each other.

20. A camera module, comprising:
two or more of the semiconductor packages according to claim 3,
wherein the semiconductor packages are arranged along a periphery of an adjustment mechanism adjusting a lens position of a camera as viewed in plan, and
wherein the longitudinal directions of the semiconductor packages are orthogonal to each other.

* * * * *